(12) United States Patent
Fujiwara et al.

(10) Patent No.: US 9,804,345 B2
(45) Date of Patent: Oct. 31, 2017

(54) OPTICAL-MODULE MEMBER, OPTICAL MODULE, AND ELECTRONIC DEVICE

(71) Applicant: SUMITOMO BAKELITE CO., LTD., Shinagawa-ku (JP)

(72) Inventors: Makoto Fujiwara, Tokyo (JP); Shinya Arai, Tokyo (JP)

(73) Assignee: SUMITOMO BAKELITE CO., LTD., Shinagawa-ku (JP)

( * ) Notice: Subject to any disclaimer, the term of this patent is extended or adjusted under 35 U.S.C. 154(b) by 124 days.

(21) Appl. No.: 14/392,134

(22) PCT Filed: Jul. 1, 2014

(86) PCT No.: PCT/JP2014/067519
§ 371 (c)(1),
(2) Date: Dec. 23, 2015

(87) PCT Pub. No.: WO2015/002188
PCT Pub. Date: Jan. 8, 2015

(65) Prior Publication Data
US 2016/0282571 A1    Sep. 29, 2016

(30) Foreign Application Priority Data

Jul. 2, 2013 (JP) ................................ 2013-138620

(51) Int. Cl.
*G02B 6/42* (2006.01)
*G02B 6/12* (2006.01)
(Continued)

(52) U.S. Cl.
CPC .......... *G02B 6/4201* (2013.01); *G02B 6/122* (2013.01); *G02B 6/12004* (2013.01);
(Continued)

(58) Field of Classification Search
CPC .. G02B 6/12004; G02B 6/122; G02B 6/4201; G02B 6/4214; G02B 6/4245;
(Continued)

(56) References Cited

U.S. PATENT DOCUMENTS

2003/0231840 A1   12/2003   Okada et al.
2004/0146253 A1*  7/2004   Wang ................... G02B 6/4249
                                                                385/93
2011/0101255 A1   5/2011   Tamura et al.

FOREIGN PATENT DOCUMENTS

JP    2001-345506 A    12/2001
JP    2002-258080 A     9/2002
(Continued)

OTHER PUBLICATIONS

International Search Report issued Sep. 30, 2014 in PCT/JP2014/067519.

*Primary Examiner* — Akm Enayet Ullah
*Assistant Examiner* — Michael Mooney
(74) *Attorney, Agent, or Firm* — Oblon, McClelland, Maier & Neustadt, L.L.P.

(57) ABSTRACT

An optical module-member is provided, including: a layer-shaped optical waveguide; a light-emitting unit substrate including an insulating substrate, light-emitting element-mounting portions where light-emitting elements are configured to be mounted so as to be optically connected to the optical waveguide, and driving element-mounting portions which are electrically connected to the light-emitting element-mounting portions where driving elements for driving the light-emitting elements are configured to be mounted; and a light-receiving unit substrate which is separated from the light-emitting unit substrate, the light-receiving unit substrate including: an insulating substrate, light-receiving element-mounting portions where light-receiving elements are configured to be mounted so as to be optically connected
(Continued)

to the optical waveguide, and signal amplification element-mounting portions which are electrically connected to the light-receiving element-mounting portions and where signal amplification elements for amplifying a signal from the light-receiving element are configured to be mounted.

20 Claims, 9 Drawing Sheets

(51) Int. Cl.
G02B 6/122 (2006.01)
H05K 1/02 (2006.01)
H05K 1/14 (2006.01)

(52) U.S. Cl.
CPC ............ *G02B 6/425* (2013.01); *G02B 6/428* (2013.01); *G02B 6/4236* (2013.01); *G02B 6/4245* (2013.01); *G02B 6/4246* (2013.01); *G02B 6/4249* (2013.01); *G02B 6/4283* (2013.01); *G02B 6/4292* (2013.01); *H05K 1/0274* (2013.01); *G02B 6/4214* (2013.01); *H05K 1/141* (2013.01); *H05K 2201/10106* (2013.01); *H05K 2201/10121* (2013.01)

(58) Field of Classification Search
CPC .. G02B 6/4236; G02B 6/4246; G02B 6/4249; G02B 6/425; G02B 6/428; G02B 6/4283; G02B 6/4292; G02B 6/4298; H05K 2201/10106; H05K 2201/1012; H05K 1/0274
USPC ....... 385/14, 24, 31, 39, 49–53, 88–92, 114, 385/129–132, 146
See application file for complete search history.

(56) References Cited

FOREIGN PATENT DOCUMENTS

| | | | |
|---|---|---|---|
| JP | 2003-501684 | A | 1/2003 |
| JP | 2004-20978 | A | 1/2004 |
| JP | 2005-173043 | A | 6/2005 |
| JP | 2005-294407 | A | 10/2005 |
| JP | 2008-15040 | A | 1/2008 |
| JP | 2009-14859 | A | 1/2009 |
| JP | 2010-26508 | A | 2/2010 |
| JP | 2011-99930 | A | 5/2011 |
| JP | 2011-221143 | A | 11/2011 |
| JP | 2012-13726 | A | 1/2012 |
| JP | 2012-14024 | A | 1/2012 |
| JP | 2012-14025 | A | 1/2012 |
| JP | 2012-78609 | A | 4/2012 |
| JP | 2013-205767 | A | 10/2013 |
| WO | WO 00/73833 | A1 | 12/2000 |

* cited by examiner

OPTICAL-MODULE MEMBER, OPTICAL MODULE, AND ELECTRONIC DEVICE

TECHNICAL FIELD

The present invention relates to an optical-module member, an optical module, and an electronic device.

Priority is claimed on Japanese Patent Application No. 2013-138620, filed Jul. 2, 2013, the content of which is incorporated herein by reference.

BACKGROUND ART

Transmission apparatuses such as router apparatuses or wavelength division multiplexing (WDM) apparatuses can be used as an apparatus which transmits information to broadband lines which can be used in rapid communication regarding large capacity information. A plurality of signal processing substrates in which an arithmetic element such as an LSI or a storage element such as a memory is incorporated are installed in the transmission apparatuses for interconnection between each line.

A circuit to which an arithmetic element or a storage element is connected through electric wirings is constructed in each signal processing substrate, but in recent years, transmission of information with higher throughput is required in each substrate according to an increase in the amount of information to be processed. However, when information transmission is rapidly performed, it actualizes problems such as occurrence of crosstalk, generation of high-frequency noise or degradation of electrical signals. Accordingly, electric wirings become a bottleneck and it is difficult to improve throughput of the signal processing substrates. In addition, the same problem occurs even in a super computer or a large-scale server.

Therefore, the above-mentioned problems are investigated to be solved by photonic technology. Optical fibers or optical waveguides which lead optical signals from one point to another point are used in photonic technology. The optical waveguide includes a linear core and a cladding which is provided to cover the surrounding of the core, the core is configured with a substantially transparent material with respect to optical signals, and the cladding is configured with a material having a lower refractive index than that of the core.

A light-emitting element such as a semiconductor laser is disposed on an incidence side of the optical waveguide and a light-receiving element such as a photodiode is disposed on an emission side thereof. Light incident from the light-emitting element is transmitted to the optical waveguide, received by the light-receiving element, and communication is performed based on a blinking pattern or a strong-weak pattern of the received light.

The above-mentioned problem of the electric wiring is solved by replacing the electric wiring in the signal processing substrate with the optical waveguide, and it is expected that the throughput of the signal processing substrate is further increased.

In a case of replacing the electric wiring with the optical waveguide, it is necessary to perform mutual conversion between an electric signal and an optical signal, and accordingly, an optical module including a light-emitting element, a light-receiving element, and an optical waveguide which optically connects the elements to each other is used.

PTL 1, for example, discloses an optical interface including a printed substrate, a light-emitting element which is mounted on the printed substrate, and an optical waveguide which is provided on a lower surface side of the printed substrate. The optical waveguide and the light-emitting element are optically connected to each other through a through hole which is a penetration hole formed in the printed substrate for transmitting the optical signal.

However, a transmission direction of the optical signal is basically limited to one direction in the optical waveguide. Accordingly, in order to perform bidirectional communication in an optical module, it is necessary that individual optical waveguides be prepared for both directions and the light-emitting element and the light-receiving element be disposed together on end portions thereof. In addition, it is necessary that a driver element for driving a light-emitting element or a signal amplification element for amplifying a signal received by the light-receiving element be disposed to be close to the light-emitting element or the light-receiving element.

When the elements are disposed to be close to the above-mentioned elements and an arithmetic element such as an LSI is disposed to be close thereto, high speed and large-capacity data transmission and reception using optical communication can be performed between the arithmetic element mounted on the optical module and the arithmetic element mounted on another module.

CITATION LIST

Patent Literature

[PTL 1] Japanese Unexamined Patent Application, First Publication No. 2005-294407

SUMMARY OF INVENTION

Technical Problem

However, it is found that when the light-emitting element and the light-receiving element are disposed to be close to each other and the driver element and the signal amplification element are disposed to be close to each other as described above, crosstalk may occur or noise may be generated between both elements. However, when the light-emitting element and the light-receiving element are separated from each other and the driver element and the signal amplification element are separated from each other, a distance between the elements and the arithmetic element naturally increases and it actualizes problems such as attenuation or delay of a signal.

Meanwhile, it is also possible to use a member which shields electromagnetic waves, but this causes a complicated structure of an optical module and results in widening of a distance between the elements and miniaturization of an optical module is disturbed.

An object of the invention is to provide an optical module which reduces crosstalk occurring between elements and can perform stable operations, an optical-module member with which such an optical module can be easily manufactured, and an electronic device having high reliability including the optical module.

Solution to Problem

Such objects are achieved by the inventions in the following (1) to (11).

(1) An optical-module member including:
a layer-shaped optical waveguide;
a light-emitting unit substrate including:
a first insulating substrate,
light-emitting element-mounting portions which are positioned on the first insulating substrate where light-emitting elements are configured to be mounted so as to be optically connected to the optical waveguide, and driving element-mounting portions which are electrically connected to the light-emitting element-mounting portions and are positioned on the first insulating substrate where driving elements for driving the light-emitting elements are configured to be mounted; and a light-receiving unit substrate which is separated from the light-emitting unit substrate, the light-receiving unit substrate including:

a second insulating substrate, light-receiving element-mounting portions which are positioned on the second insulating substrate where light-receiving elements are configured to be mounted so as to be optically connected to the optical waveguide, and signal amplification element-mounting portions which are electrically connected to the light-receiving element-mounting portions and are positioned on the second insulating substrate where signal amplification elements for amplifying a signal from the light-receiving element are configured to be mounted.

(2) The optical-module member according to (1), in which the light-emitting unit substrate and the light-receiving unit substrate are close to each other.

(3) The optical-module member according to (1), in which a separation distance between the light-emitting unit substrate and the light-receiving unit substrate is from 0.05 mm to 20 mm.

(4) The optical-module member according to (1), in which a separation distance between the light-emitting unit substrate and the light-receiving unit substrate is equal to or greater than 0.05 mm and smaller than 5 mm.

(5) The optical-module member according to any one of (1) to (4), in which the optical waveguide and a plurality of the light-emitting unit substrates are provided, and the light-emitting element-mounting portion of each light-emitting unit substrate is configured so that each light-emitting element is optically connected to the optical waveguide.

(6) The optical-module member according to any one of (1) to (4), in which the optical waveguide and a plurality of the light-receiving unit substrates are provided, and the light-receiving element-mounting portion of each light-receiving unit substrate is configured so that each light-receiving element is optically connected to the optical waveguide.

(7) The optical-module member according to any one of (1) to (6), in which the optical waveguide, the plurality of light-emitting unit substrates, and a plurality of the light-receiving unit substrates are provided, the light-emitting element-mounting portion of each light-emitting unit substrate is configured so that each light-emitting element is optically connected to the optical waveguide, and the light-receiving element-mounting portion of each light-receiving unit substrate is configured so that each light-receiving element is optically connected to the optical waveguide.

(8) The optical-module member according to (5) or (7), in which the two light-emitting unit substrates are disposed so that the two light-emitting element-mounting portions are positioned between the two driving element-mounting portions.

(9) The optical-module member according to (6) or (7), in which the two light-receiving unit substrates are disposed so that the two light-receiving element-mounting portions are positioned between the two signal amplification element-mounting portions.

(10) An optical module including:

the optical-module member according to any one of (1) to (9);

light-emitting elements which are mounted on the light-emitting element-mounting portions;

driving elements which are mounted on the driving element-mounting portions;

light-receiving elements which are mounted on the light-receiving element-mounting portions; and signal amplification elements which are mounted on the signal amplification element-mounting portions.

(11) An electronic device including:

the optical module according to (10).

Advantageous Effects of Invention

According to the invention, an optical module which reduces crosstalk occurring between elements and can perform stable operations is obtained.

In addition, according to the invention, an optical-module member with which the optical module can be easily manufactured is obtained.

Further, according to the invention, an electronic device having high reliability including the optical module and is obtained.

DESCRIPTION OF EMBODIMENTS

Hereinafter, an optical-module member, an optical module, and an electronic device of the invention will be described in detail based on preferred embodiments shown in the accompanied drawings, but the invention is not limited to these examples. Addition, omission, replacement, and other modifications of the configurations can be performed within a range not departing from the gist of the invention.

Optical Module and Optical-Module Member

First Embodiment

First, a first embodiment of an optical module of the invention and a first embodiment of an optical-module member of the invention will be described.

Figure 1:
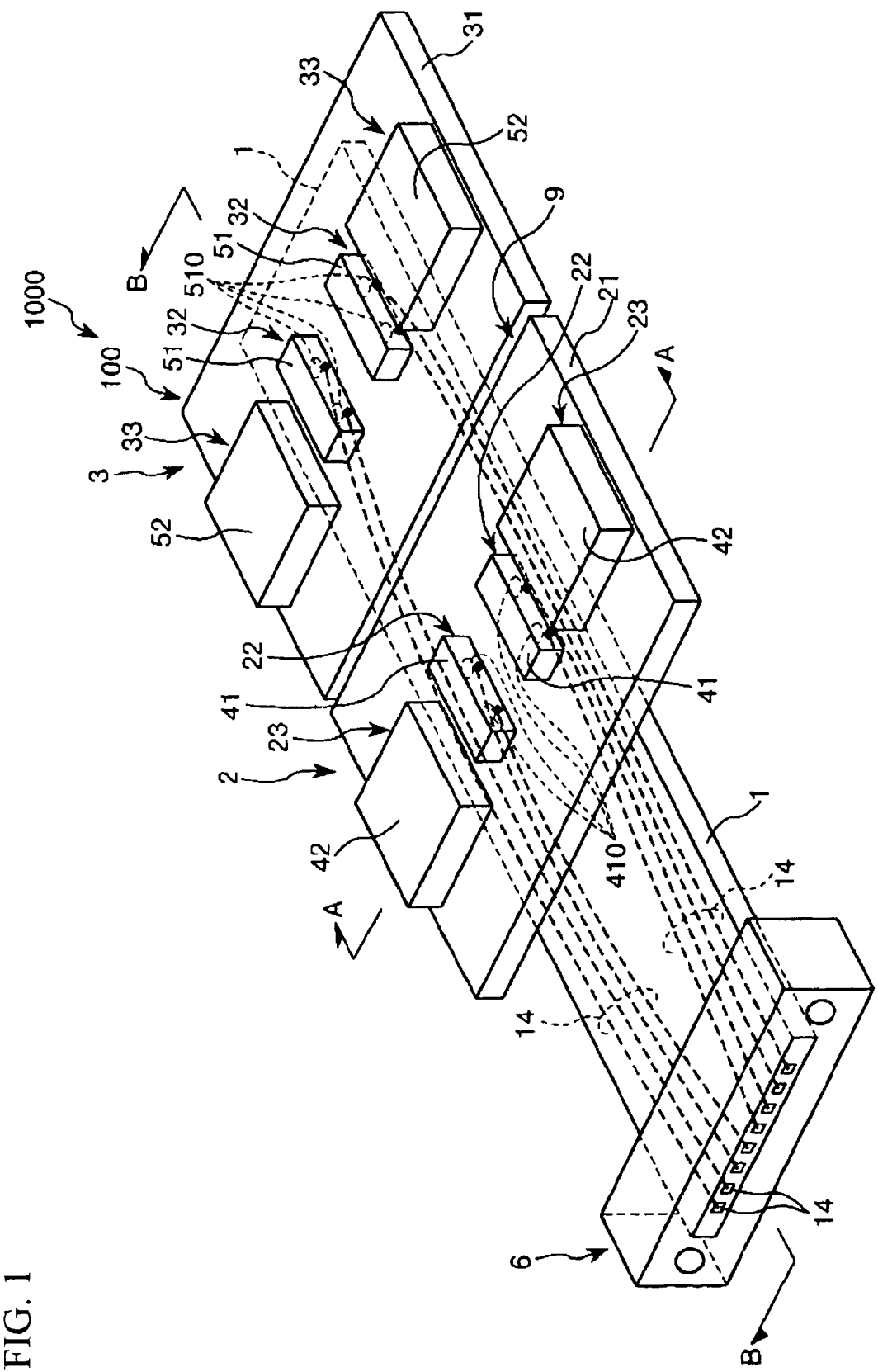
FIG. 1 is a perspective view showing a first embodiment of an optical module of the invention.
Figure 2:
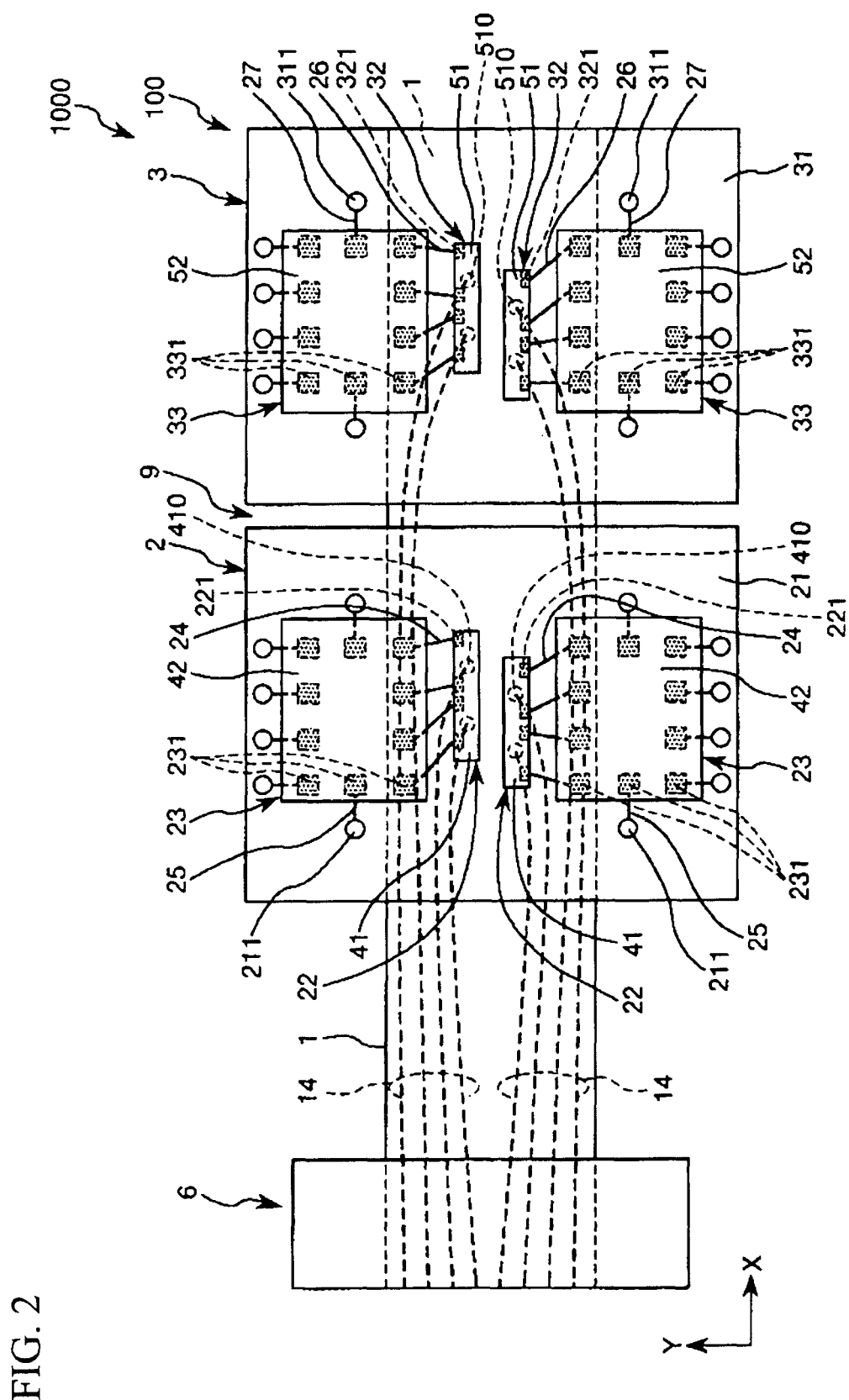
FIG. 2 is a plan view of the optical module shown in FIG. 1.
Figure 3:
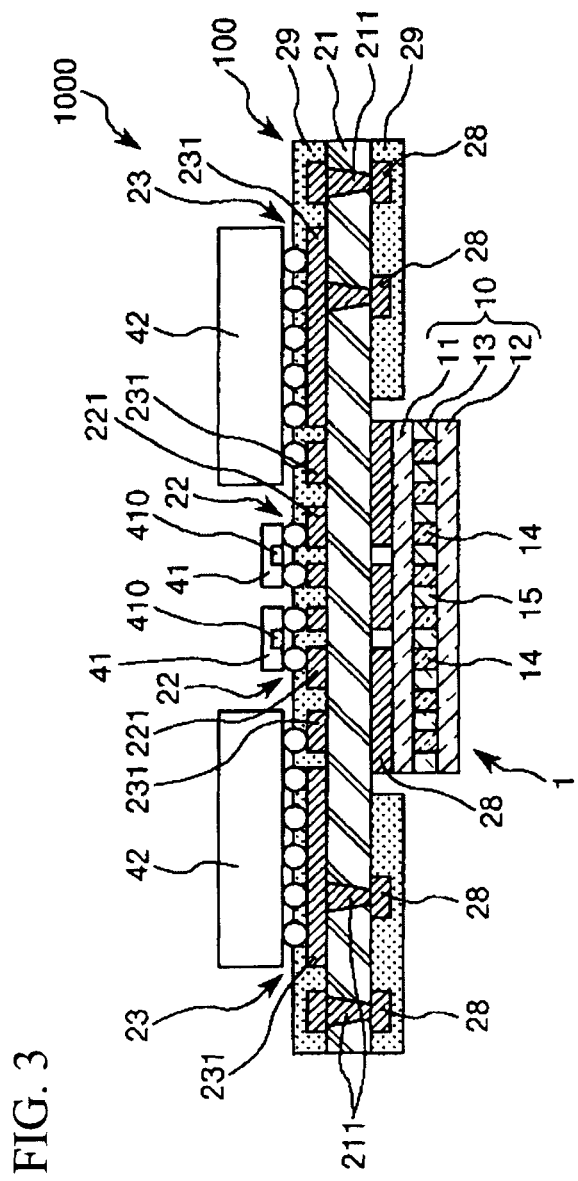
FIG. 3 is a sectional view taken along line A-A shown in FIG. 1.
Figure 4:
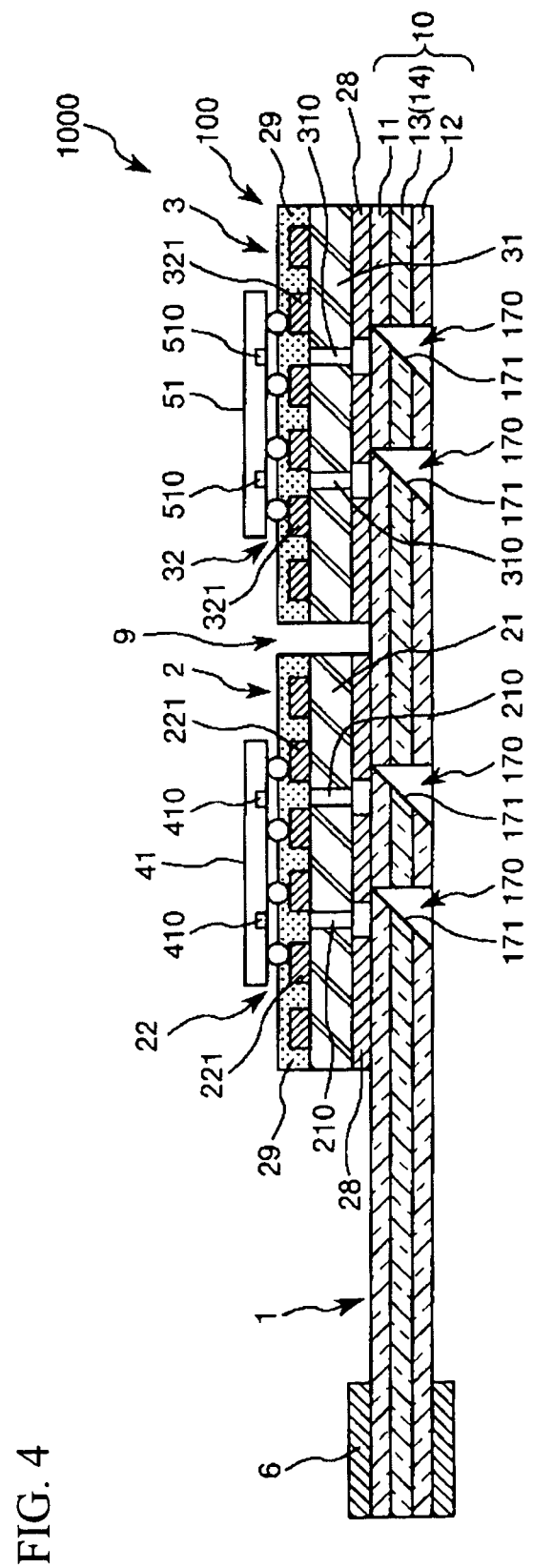
FIG. 4 is a sectional view taken along line B-B shown in FIG. 1.

FIG. 1 is a perspective view showing the first embodiment of the optical module of the invention, FIG. 2 is a plan view of the optical module shown in FIG. 1, FIG. 3 is a sectional view taken along line A-A shown in FIG. 1, and FIG. 4 is a sectional view taken along line B-B shown in FIG. 1. FIGS. 1 and 2 show an optical waveguide behind each substrate with dotted lines.

An optical module 1000 shown in FIG. 1 includes an optical-module member 100 including a layer-shaped optical waveguide 1 having an elongated shape in a plan view, a light-emitting unit substrate 2 and a light-receiving unit substrate 3 which are laminated on one end portion of the optical waveguide 1, and an optical connector 6 which is provided on another end portion of the optical waveguide 1.

The light-emitting unit substrate 2 of the optical-module member 100 includes an insulating substrate (first insulating substrate) 21, light-emitting element-mounting portions 22 where light-emitting elements are configured to be mounted, and driving element-mounting portions 23 where driving elements are configured to be mounted. In addition, the light-receiving unit substrate 3 includes an insulating substrate (second insulating substrate) 31, light-receiving element-mounting portions 32 where light-receiving elements are configured to be mounted, and signal amplification element-mounting portions 33 where signal amplification elements are configured to be mounted.

In addition to the optical-module member 100 described above, the optical module 1000 shown in FIG. 1 further includes light-emitting elements 41 mounted on the light-emitting element-mounting portions 22, driving elements 42 mounted on the driving element-mounting portions 23, light-receiving elements 51 mounted on the light-receiving element-mounting portions 32, and signal amplification elements 52 mounted on the signal amplification element-mounting portions 33.

In such an optical module 1000, light emitted from the light-emitting elements 41 is transmitted to the optical connector 6 through the optical waveguide 1 and light incident to the optical waveguide 1 in the optical connector 6 is received by the light-receiving elements 51. With such transmission of light, it is possible to perform optical communication between the light-emitting elements 41 and the light-receiving elements 51, and the optical connector 6.

Hereinafter, configurations of each unit of the optical module 1000 will be described in order.

(Optical Waveguide)

First, the optical waveguide 1 will be described.

Figure 5:
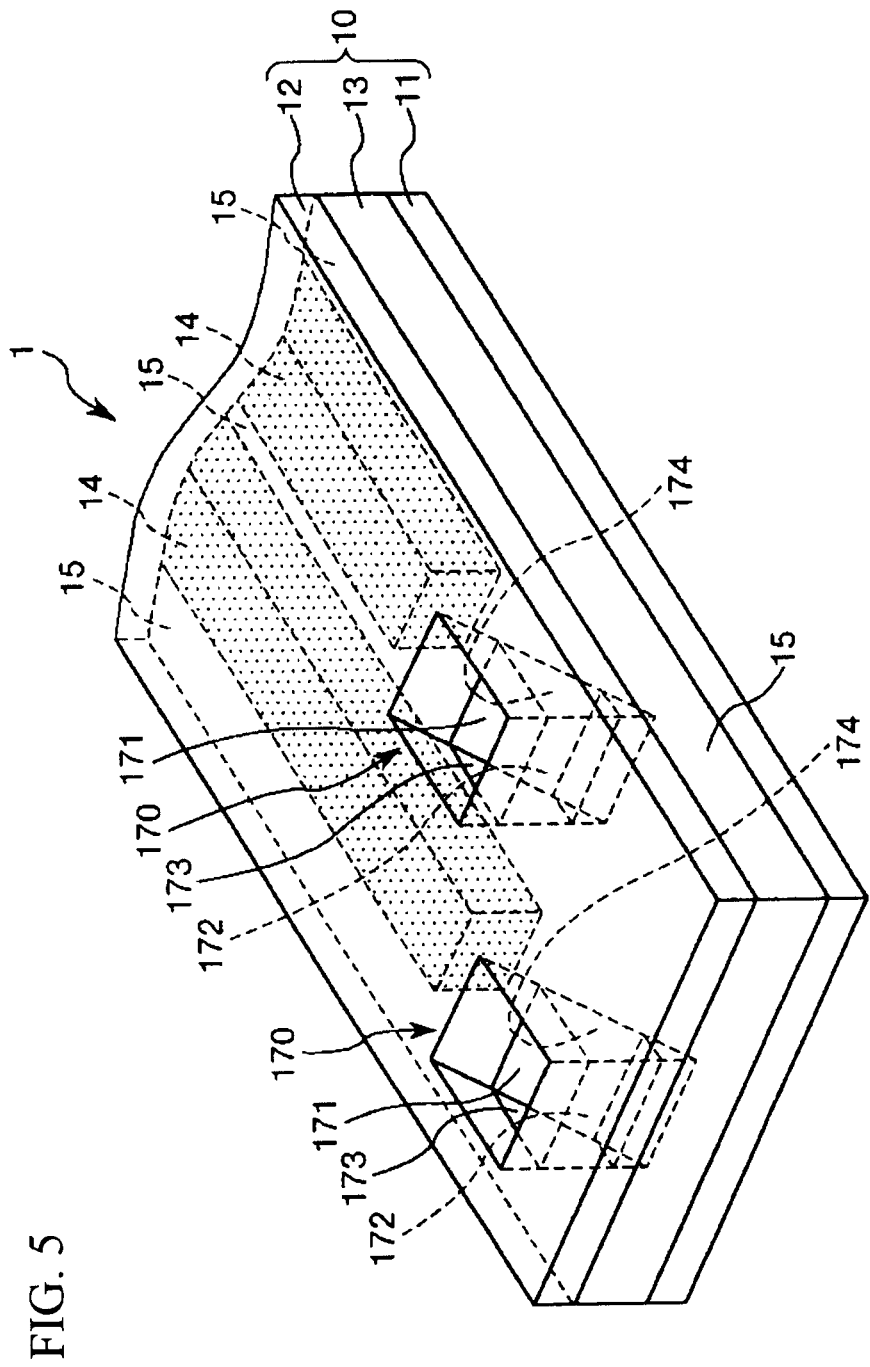
FIG. 5 is a perspective view showing an enlarged part of an optical waveguide included in the optical module shown in FIG. 4.

FIG. 5 is a perspective view showing an enlarged part of the optical waveguide included in the optical module shown in FIG. 4. FIG. 5 shows the vertically reversed optical waveguide shown in FIG. 4.

The optical waveguide 1 shown in FIG. 5 includes a laminate 10 in which a cladding layer 11, a core layer 13, and a cladding layer 12 are laminated from the lower side in this order. As shown in FIG. 5, elongated cores 14 and side surface cladding portions 15 provided to be adjacent to the side surfaces of the cores are formed in the core layer 13. In FIG. 5, the cores 14 and the side surface cladding portions 15 in the core layer 13 which are shown through the cladding layer 12 are also shown with dotted lines.

A width and a height of the cores 14 (thickness of the core layer 13) are not particularly limited, but are preferably approximately from 1 μm to 200 μm and more preferably approximately from 5 μm to 100 μm. Accordingly, it is possible to increase the transmission efficiency of the cores 14 and realize high density of the cores 14. That is, since it is possible to increase the number of cores 14 which can be laid per unit area, it is possible to perform large capacity optical communication even with a small area.

The number of cores 14 formed in the core layer 13 are not particularly limited, but is, for example, from 2 to 100.

Recesses 170 formed by working of removing some parts of the optical waveguide are formed in the optical waveguide 1. The recesses 170 shown in FIG. 5 are an extension of the end portions of the cores 14 and are formed in positions corresponding to the side surface cladding portions 15. A part of the inner surfaces of each of the recesses 170 is configured with an inclined surface 171 which is inclined with respect to the same plane as the core layer 13. The inclined surface 171 functions as a mirror (optical path conversion unit) which performs conversion of an optical path of the cores 14. That is, the mirror formed of the inclined surface 171 performs conversion of a transmission direction of light by reflecting the light transmitting through the cores 14 shown in FIG. 5 towards the lower side of FIG. 5, for example.

As shown in FIG. 5, the inclined surface 171 is a flat surface which is continuously formed from the cladding layer 12 to the cladding layer 11 through the core layer 13. In addition, a vertical surface 172 is provided in a position opposing the inclined surface 171 among the inner surfaces of the recesses 170. The vertical surface 172 is a flat surface which is continuously formed from the cladding layer 12 to the cladding layer 11 through the core layer 13 and is a surface orthogonal to the same plane of the core layer 13. In the embodiment, a case where the inclined surface 171 is a flat surface has been described as an example, but in the invention, it is not necessary that the inclined surface 171 is a flat surface, and the inclined surface may be a curved surface, if necessary, and may be a flat surface having partially different inclination angles.

Meanwhile, two surfaces which are approximately parallel to an optical axis of the cores 14 among the inner surfaces of the recesses 170 are also vertical surfaces 173 and 174 which are orthogonal to the same plane of the core layer 13, respectively.

The inner surfaces of each of the recesses 170 are configured with the inclined surface 171 and the three vertical surfaces 172, 173, and 174.

A maximum depth of the recess 170 is suitably set according to the thickness of the laminate 10 and is not particularly limited, but is preferably approximately from 1 μm to 500 μm and more preferably approximately from 5 μm to 400 μm, from viewpoints of mechanical strength and flexibility of the optical waveguide 1. The recess 170 may partially penetrate through the laminate 10.

A maximum length of the recess 170, that is, a maximum length of a component of the opening of the recess 170 of FIG. 5 which is parallel to the optical axis of the core 14 is not particularly limited, and is preferably approximately from 2 μm to 1200 μm and more preferably approximately from 10 μm to 1000 μm, from a viewpoint of a relationship between the maximum length and the thickness of the cladding layers 11 and 12 or the core layer 13 or the inclination angle of the inclined surface 171.

A maximum width of the recess 170, that is, a maximum length of a component of the opening of the recess 170 of FIG. 5 which is orthogonal to the optical axis of the core 14 is not particularly limited, and is suitably set according to the width of the cores 14 or the like, but is preferably approximately from 1 μm to 600 μm and more preferably approximately from 5 μm to 500 μm.

One recess 170 may be formed for one core 14, but one recess 170 may be provided over the plurality of cores 14.

In a case of forming the plurality of recesses 170, formation positions thereof may be the same positions in a longitudinal direction of the cores 14 or may be deviated from each other in the longitudinal direction as shown in FIG. 5.

The shape of the opening of the recess 170 shown in FIG. 1 is a rectangular shape, but the shape of the opening of the recess 170 worked in the invention is not limited thereto and may be any shape, and for example, a polygon such as a pentagon or a hexagon or a circular shape such as an ellipse or an oval is used.

In addition, since the inclined surface 171 functions as a mirror, the inclination angle thereof is suitably set according to a direction in which the optical path of the cores 14 is converted, but when the same plane of the core layers 13 is set as a reference surface, an angle (acute angle side) formed by the reference surface and the inclined surface 171 is preferably approximately from 30° to 60° and more preferably approximately from 40° to 50°. By setting the inclination angle in the range described above, it is possible to efficiently convert the optical path of the core 14 in the inclined surface 171 and to prevent a loss caused by the conversion of the optical path.

Meanwhile, an angle (acute angle side) formed by the reference surface and the vertical surfaces 172, 173, and 174 is preferably approximately from 60° to 90°. The angle thereof is approximately 90° in each drawing. The angle formed by the reference surface and the vertical surfaces 172, 173, and 174 is not limited to the range described above and may be smaller than 60°.

As a configuration material (main material) of the core layer 13 and the cladding layers 11 and 12 described above, various resin materials such as an acrylic resin, a methacrylic resin, polycarbonate, polystyrene, a cyclic ether resin such as an epoxy resin or an oxetane resin, polyamide, polyimide, polybenzoxazole, polysilane, polysilazane, a silicone resin, a fluorine resin, polyurethane, a polyolefin resin, polybutadiene, polyisoprene, polychloroprene, polyester such as PET or PBT, polyethylene succinate, polysulfone, polyether, and a cyclic olefin resin such as a benzocyclobutene-based resin or a norbornene resin can be used. The resin material may be a composite material obtained by incorporating materials having different compositions from each other. These can be easily worked by laser working and accordingly are suitable for the configuration materials of the core layer 13 or the cladding layers 11 and 12.

A fixing method of the optical waveguide 1, and the light-emitting unit substrate 2 and the light-receiving unit substrate 3 is not particularly limited, but a method of bonding those using various adhesives such as an epoxy adhesive, an acrylic adhesive, an urethane adhesive, a silicone adhesive, or various hot-melt adhesives (polyester or modified-olefin based), or an adhesive sheet is used.

(Optical Connector)

The optical connector 6 is a member for optically connecting the optical waveguide 1 with another optical member, for example, an optical fiber or another optical waveguide. By using a detachable member as the optical connector 6 between the optical waveguide and another optical member, it is possible to easily perform an operation of optically connecting the optical module 1000 and another optical member to each other or disconnecting those from each other. Therefore, it is possible to further increase mounting easiness of the optical module 1000.

The structure of the optical connector 6 is not particularly limited, and a structure based on various connector standards is used, for example. Specifically, a connector corresponding to a PMT connector, an MT connector based on JIS C 5981, a 16MT connector, a two-dimensional arrangement-type MT connector, an MPO connector, an MPX connector, or the like is used.

The optical connector 6 shown in FIG. 1 is configured to receive and emit light from and to the end surface of the cores 14, but the optical connector 6 used in the invention is not limited to a connector having such a system. For example, a mirror for conversion of an optical path may be provided on the end portion of the cores 14 where the optical connector 6 is provided, and the optical waveguide may be connected to another optical member which is provided on an upper surface side or a lower surface side of the optical waveguide 1, for example.

In addition, the optical connector 6 shown in FIG. 1 corresponds to a so-called receptacle among structures based on various connector standards described above. By fitting a plug attached to an end portion of an optical fiber to this receptacle, for example, the optical fiber on the plug side and the optical waveguide 1 on the receptacle side are optically connected to each other. The optical connector 6 shown in FIG. 1 may not be a receptacle and may be a plug.

The optical waveguide 1 may be divided into two and each optical connector 6 may be attached to the end portions of the divided optical waveguides 1. That is, the optical module 1000 may include the plurality of optical connectors 6.

(Light-Emitting Unit Substrate and Light-Receiving Unit Substrate)

As described above, the light-emitting unit substrate 2 includes the insulating substrate (first insulating substrate) 21, the light-emitting element-mounting portions 22 where the light-emitting elements 41 are configured to be mounted, and the driving element-mounting portions 23 where the driving elements 42 are configured to be mounted.

In addition, as described above, the light-receiving unit substrate 3 includes the insulating substrate (second insulating substrate) 31, the light-receiving element-mounting portions 32 where the light-receiving elements 51 are configured to be mounted, and the signal amplification element-mounting portions 33 where the signal amplification elements 52 are configured to be mounted.

It is preferable that the optical waveguide 1 be provided on the surfaces of the light-emitting unit substrate 2 and the light-receiving unit substrate 3 on a side opposite to the light-emitting element-mounting portions 22, the driving element-mounting portions 23, the light-receiving element-mounting portions 32, and the signal amplification element-mounting portions 33.

In an optical module of the related art, light-emitting element-mounting portions, driving element-mounting portions, light-receiving element-mounting portions, and signal amplification element-mounting portions are provided on the same substrate in a mixed manner. With respect thereto, the light-emitting unit substrate 2 and the light-receiving unit substrate 3 are laminated on an end portion of the optical waveguide 1 on a side opposite to an end portion on which the optical connector 6 is provided, and a slight gap 9 is provided between the light-emitting unit substrate 2 and the light-receiving unit substrate 3. That is, in the optical module 1000 (optical-module member 100) according to the embodiment, the light-emitting element-mounting portions 22 and the driving element-mounting portions 23 for light emission are provided on the light-emitting unit substrate 2, and the light-receiving element-mounting portions 32 and the signal amplification element-mounting portions 33 for light-receiving are provided on the light-receiving unit substrate 3. Accordingly, a portion for mounting elements related to light emission and a portion for mounting elements related to light-receiving are provided on separate substrates and the substrates are separated from each other.

By configuring the optical-module member 100 as described above, electromagnetic noise generated from the light-emitting elements 41 or the driving elements 42, for example, hardly enters the light-receiving unit substrate 3, even when the electromagnetic noise is transmitted through the surface or the inside of the light-emitting unit substrate 2. Accordingly, the electromagnetic noise superimposing on power lines or signal lines of the light-receiving elements 51 or the signal amplification elements 52 (crosstalk) is prevented and it is possible to prevent occurrence of malfunctions such as a decrease in an S/N ratio of a signal, a decrease in a communication speed, or an erroneous operation of the light-receiving elements 51 or the signal amplification elements 52.

Particularly, large power consumption is required for the light-emitting elements 41 and a large current is necessary for the driving thereof. Accordingly, there is a problem that strong electromagnetic noise may be naturally generated from electric wirings 24 which connect lands 231 of the driving element-mounting portions 23 and lands 221 of the light-emitting element-mounting portions 22 to each other or electric wirings 25 which connect field vias 211 provided on the insulating substrate 21 and the lands 231 of the driving element-mounting portions 23.

Meanwhile, the light-receiving elements 51 input a weak current obtained by performing conversion of an optical signal to the signal amplification elements 52. Accordingly, the weaker current compared to the light-emitting unit substrate 2 may flow through electric wirings 26 which connect lands 321 of the light-receiving element-mounting portions 32 and lands 331 of the signal amplification element-mounting portions 33 to each other or electric wirings 27 which connect field vias 311 provided on the insulating substrate 31 and the lands 331 of the signal amplification element-mounting portions 33. Therefore, the wirings are in a state to be easily affected by the electromagnetic noise.

As described above, in the embodiment, the gap 9 is provided between the light-emitting unit substrate 2 and the light-receiving unit substrate 3. Therefore, even when electromagnetic noise is generated from the light-emitting unit substrate 2, an effect of preventing negative effects (occurrence of crosstalk) on the light-receiving unit substrate 3 due to the electromagnetic noise is exhibited. Accordingly, according to the invention, it is possible to prevent a decrease in an S/N ratio of an optical signal or a communication speed in the light-receiving unit substrate 3, prevent erroneous operations of the light-receiving elements 51 or the signal amplification elements 52, and realize stable operations. In addition, it is not necessary that output of the light-emitting elements 41 is excessively increased, in order to increase the S/N ratio of the optical signal, and accordingly, it is possible to reduce power consumption of the optical module 1000.

Further, it is possible to arrange the light-emitting unit substrate 2 and the light-receiving unit substrate 3 to be closer with the effects described above, compared to the related art. Therefore, it is possible to realize miniaturization of the optical module 1000 and increase mounting easiness of the optical module 1000.

The insulating substrate 21 of the light-emitting unit substrate 2 may be any substrate, as long as it is a substrate having insulating properties, and examples of the configuration material include various resin materials such as a polyimide resin, a polyamide resin, an epoxy resin, various vinyl resins, and a polyester resin such as a polyethylene telephthalate resin. In addition, a substrate impregnated with resin materials such as a phenol resin, a polyester resin, an epoxy resin, a cyanate resin, a polyimide resin, or a fluorine resin on a base material, using paper, a glass fabric, or a resin film as the base material, specifically, an insulating substrate used for a composite copper clad laminated plate such as a glass fabric•epoxy copper clad laminated plate or a glass non-fabric•epoxy copper clad laminated plate, a heat-resistant and thermoplastic organic rigid substrate such as a polyetherimide resin substrate, a polyetherketone resin substrate, or a polysulphone resin substrate, or a ceramic rigid substrate such as an alumina substrate, an aluminum nitride substrate, or a silicon carbide substrate can be used.

Meanwhile, the insulating substrate 31 included in the light-receiving unit substrate 3 have the same configuration as that of the insulating substrate 21 described above.

The field vias 211 are disposed on the light-emitting unit substrate 2 so as to surround the driving element-mounting portions 23. The field vias 211 penetrate through the insulating substrate 21 and a bump (not shown) is bonded to a rear surface side of the insulating substrate 21 shown in FIG. 2 so as to be electrically connected to the field vias 211. The driving element-mounting portions 23 (light-emitting unit substrate 2) can be electrically connected to an external electric circuit through this bump. As shown in FIG. 4, the optical module 1000 includes electric wirings 28 on the lower surface side of the light-emitting unit substrate 2.

Portions of the light-emitting unit substrate 2 which are set so as to mount the light-emitting elements 41 on the insulating substrate 21 are the light-emitting element-mounting portions 22. The light-emitting element-mounting portions 22 include the plurality of lands 221 for mounting the light-emitting elements 41. The lands 221 are conductive layers provided on the insulating substrate 21 and can be arranged and a shape in a plan view can be formed according to terminals (not shown) of the light-emitting elements 41. In the same manner as described above, portions which are set so as to mount the driving elements 42 on the insulating substrate 21 are driving element-mounting portions 23. In the same manner as in the case of the light-emitting element-mounting portions 22, the driving element-mounting portions 23 also include the plurality of lands 231 for mounting the driving elements 42.

In such a light-emitting unit substrate 2, each land 221 and each land 231 are electrically connected to each other through the electric wiring 24 and each land 231 and the field via 211 are electrically connected to each other through the electric wiring 25.

Meanwhile, the field vias 311 are disposed on the light-receiving unit substrate 3 so as to surround the signal amplification element-mounting portions 33. The field vias 311 penetrate through the insulating substrate 31 and a bump (not shown) is bonded to a rear surface side of the insulating substrate 31 shown in FIG. 2 so as to be electrically connected to the field vias 311. The signal amplification element-mounting portions 33 (light-receiving unit substrate 3) can be electrically connected to an external electric circuit through this bump. As shown in FIG. 4, the optical module 1000 includes the electric wirings 28 on the lower surface side of the light-receiving unit substrate 3.

Portions of the light-receiving unit substrate 3 which are set so as to mount the light-receiving elements 51 on the insulating substrate 31 are the light-receiving element-mounting portions 32. The light-receiving element-mounting portions 32 include the plurality of lands 321 for mounting the light-receiving elements 51. The lands 321 are conductive layers provided on the insulating substrate 31 and can be arranged and a shape in a plan view can be formed according to terminals (not shown) of the light-receiving elements 51. In the same manner as described above, portions which are set so as to mount the signal amplification elements 52 on the insulating substrate 31 are the signal amplification element-mounting portions 33. In the same manner as in the case of the light-receiving element-mounting portions 32, the signal amplification element-mounting portions 33 also include the plurality of lands 331 for mounting the signal amplification elements 52.

In such a light-receiving unit substrate 3, each land 321 and each land 331 are electrically connected to each other through the electric wiring 26 and each land 331 and the field via 311 are electrically connected to each other through the electric wiring 27.

The electric wirings 24, 25, 26, 27 and 28, the lands 221, 231, 321, and 331, and the field vias 211 and 311 are configured with a conductive material, respectively. Examples of a conductive material include simple metal such as copper, aluminum, nickel, chromium, zinc, tin, gold or silver, and an alloy containing these metal elements.

As shown in FIG. 4, the light-emitting unit substrate 2 and the light-receiving unit substrate 3 include solder resist layers 29 which cover some parts of lands or electric wirings. Accordingly, it is possible to protect oxidization or corrosion of the lands or the electric wirings and further increase long-term reliability of the light-emitting unit substrate 2 or the light-receiving unit substrate 3. In addition, insulating properties are also improved.

The solder resist layers 29 are configured with various resin materials and contain an inorganic filler, if necessary.

The two light-emitting element-mounting portions 22 and the two driving element-mounting portions 23 are provided in the light-emitting unit substrate 2 shown in FIGS. 1 and 2 in a mixed manner. In the same manner as described above, the two light-receiving element-mounting portions 32 and the two signal amplification element-mounting portions 33 are provided in the light-receiving unit substrate 3 in a mixed manner. Due to the reasons described above, it is preferable that the light-emitting element 41 and the driving element 42, and the light-receiving element 51 and the signal amplification element 52 are arranged to be separated from each other. Meanwhile, the plurality of light-emitting elements 41 may be provided on the same substrate in a mixed manner or the plurality of driving elements 42 may be provided on the same substrate in a mixed manner, because, although the generation of electromagnetic noise is not prevented, the electromagnetic noise hardly superimposes on lines or negative effects from the superimposition is hardly affected to operations of the elements. In the same manner, the plurality of light-receiving elements 51 may be provided on the same substrate in a mixed manner or the plurality of signal amplification elements 52 may be provided on the same substrate in a mixed manner.

As described above, it is possible to reduce the number of light-emitting unit substrates 2 or the light-receiving unit substrates 3, simplify the configuration of the optical module 1000, and reduce the number of assembling processes.

In the related art, the two light-emitting elements 41, the two driving elements 42, the two light-receiving elements 51, and the two signal amplification elements 52 are mounted on the same substrate. However, in this case, it is necessary that, not only a positional relationship between the light-emitting element-mounting portions 22, but also a positional relationship between the light-emitting element-mounting portion 22 and the light-receiving element-mounting portion 32 be properly set according to the position of the inclined surface 171 of the optical waveguide 1, in advance. Accordingly, when manufacturing the substrate in which the elements are provided in a mixed manner, it is necessary that positional relationships between a plurality of mounting units be set as designed, and it increases difficulty of the manufacturing of the substrate. In addition, in this case, it is necessary that, not only an error of a separation distance between the mounting units, but also an error of an intersecting angle formed by a direction in which the two light-emitting element-mounting portions 22 are lined up and a direction in which the light-emitting element-mounting portion 22 and the light-receiving element-mounting portion 32 are lined up be held to be extremely small from a designed value. Accordingly, in the optical module of the related art, there is a problem that difficulty is high in positioning (alignment) of the optical waveguide and the substrate where each element is mounted.

With respect thereto, in the optical module 1000 shown in FIG. 1, the substrate is divided into the light-emitting unit substrate 2 and the light-receiving unit substrate 3, and accordingly, it is possible to alleviate a tolerance of an error from a designed value at least regarding the intersecting angle described above. Therefore, in the optical module 1000, it is possible to easily assemble the light-emitting unit substrate 2 or the light-receiving unit substrate 3 and reduce position deviation of the light-emitting element-mounting portions 22 and the light-receiving element-mounting portions 32 with respect to the optical waveguide 1. Thus, it is possible to further increase the optical coupling efficiency of the light-emitting elements 41 or the light-receiving elements 51 and the optical waveguide 1.

In addition, in the light-emitting unit substrate 2 or the light-receiving unit substrate 3, mounting positions of the light-emitting elements 41 or the light-receiving elements 51 depend on the formation positions of the lands 221 or the lands 321. Accordingly, in the optical module 1000 shown in FIG. 1, when manufacturing the light-emitting unit substrate 2 or the light-receiving unit substrate 3, a tolerance of position deviation of the lands 221 and the lands 321 is relatively loose, the manufacturing easiness thereof is also high.

The optical waveguide 1 may be slightly deformed in the process of the manufacturing and dimensions thereof may not be the designed values. In addition, when the optical waveguide 1 is configured with resin materials, particularly, dimensions of the optical waveguide 1 are easily affected by a temperature and the dimensions of the optical waveguide 1 may be slightly changed due to the surrounding temperature.

Even in this case, when the substrate is divided into the light-emitting unit substrate 2 and the light-receiving unit substrate 3, the position deviation of the inclined surface 171 due to the deformation of the optical waveguide 1 described above can be absorbed by changing the positional relationship between the light-emitting unit substrate 2 and the light-receiving unit substrate 3. Accordingly, the optical coupling efficiency of the light-emitting elements 41 or the light-receiving elements 51 and the optical waveguide 1 can be further increased.

In the optical module of the invention, light emitted from optical elements mounted on the substrate is precisely set to pass through the mirror-attached optical waveguide which is bonded to the rear surface of the substrate, and accordingly, optical communication can be performed. A part where a manufacturing tolerance (position deviation) is generated, when assembling the optical module of the invention, is in a bonding step of receiving and emitting light points of optical elements and the center of the mirror to each other. A high-precision flip chip bonding (FCB) method is generally used in this bonding and a device tolerance at that time is approximately ±5 µm.

However, a tolerance is approximately ±10 µm in practice, and is a varied value. The reason thereof is because that, when each optical element is mounted on one substrate by the FCB method, the additional mounting tolerance of the optical elements with respect to the substrate which is ±5 µm is included, and accordingly, when a tolerance is based on one element, the other element has a tolerance containing the manufacturing tolerance described above.

With respect thereto, when the light-emitting element and the light-receiving element are separately mounted on the divided substrates with respect to one optical waveguide, the manufacturing tolerance is only ±5 µm and an optical loss value is significantly improved. For example, in the light-receiving element, an optical loss value corresponding to the tolerance of ±10 µm is 1 dB, but when the tolerance is ±5 µm, the optical loss value is improved to a value of approximately 0.4 dB. In addition, since the divided substrates are bonded to one optical waveguide, the two substrates do not fall in pieces and take on the same role as in a case where the substrate is not divided.

By dividing the substrate, tolerance (±5 µm) is additionally generated between electric terminals given to the substrates (for example, substrate A and substrate B). However, a pitch between terminals of connection tolerance between a terminal of each substrate and a terminal of another substrate (for example, substrate C) connected thereto is sufficiently great and mounting deviation is allowed up to a value of approximately 100 µm. Accordingly, even when the substrates A and B are attached to the substrate C using a general mounter (for example, a mounting accuracy of ±20 to 30 µm), the mounting can be performed by easily absorbing ±5 µm of the tolerance between terminals generated between the substrates A and B.

It is preferable that the light-emitting unit substrate 2 and the light-receiving unit substrate 3 be close to each other.

The expression "being close" means that a separation distance between the light-emitting unit substrate 2 and the light-receiving unit substrate 3 (distance of the gap 9) is from 0.05 mm to 20 mm. The separation distance described above is preferably set to be equal to or greater than 0.05 mm and smaller than 5 mm. By setting the separation distance in the range described above, it is possible to prevent crosstalk between the light-emitting unit substrate 2 and the light-receiving unit substrate 3 and realize miniaturization of the optical module 1000.

The separation distance depends on the configuration of the light-emitting unit substrate 2 or the light-receiving unit substrate 3, but the separation distance is generally a separation distance between the insulating substrate 21 and the insulating substrate 31, in many cases. Since the insulating substrates substantially do not have conductivity, the insulating substrates are not electrically connected, but when the insulating substrates are separated by a predetremined distance, transmission of electromagnetic noise generated through the insulating substrates is sufficiently prevented.

That is, when the separation distance is smaller than the lower limit value, depending on the intensity of the electromagnetic noise, but the electromagnetic noise from the light-emitting unit substrate 2 may superimpose on the light-receiving unit substrate 3. In addition, when the separation distance is greater than the upper limit value, it is difficult to further increase the effects for preventing crosstalk and miniaturization of the optical module 1000 is disturbed.

(Light-Emitting Element and Light-Receiving Element)

As shown in FIG. 4, the light-emitting element 41 includes two light-emitting units 410. The light-emitting units 410 are optically connected to the inclined surface 171 of the optical waveguide 1 through penetration holes 210 provided on the insulating substrate 21. Accordingly, light emitted from the light-emitting units 410 passes through the penetration holes 210, is reflected by the inclined surface 171, and enters the cores 14.

Meanwhile, as shown in FIG. 4, the light-receiving element 51 includes two light-receiving units 510. The light-receiving units 510 are optically connected to the inclined surface 171 of the optical waveguide 1 through penetration holes 310 provided on the insulating substrate 31. Accordingly, light transmitted from the left side to the right side of FIG. 4 through the cores 14 is reflected upward by the inclined surface 171, passes through the penetration holes 210, and enters the light-receiving units 510.

Examples of the light-emitting element 41 include a surface-emitting laser (VCSEL), a laser diode (LD), a light-emitting diode (LED), and an organic EL element.

Meanwhile, examples of the light-receiving element include a photodiode (PD or APD) and the like.

A mounting method of the light-emitting elements 41 on the light-emitting element-mounting portions 22 and a mounting method of the light-receiving elements 51 on the light-receiving element-mounting portions 32 are not particularly limited, and a flip chip bonding method, a die bonding method, or a wire bonding method may be used.

(Driving Element and Signal Amplification Element)

As described above, the driving element 42 is an element having a function of driving the light-emitting elements 41. Specifically, a driver IC (LDD) or an LSI is used.

Meanwhile, the signal amplification element 52 is an element which amplifies an electric signal converted by the light-receiving elements 51. Specifically, a transimpedance amplifier (TIA), a limiting amplifier (LA), or a combination IC having the combined functions thereof is used.

A mounting method of the driving elements 42 on the driving element-mounting portions 23 and a mounting method of the signal amplification elements 52 on the signal amplification element-mounting portions 33 are not particularly limited, and the same method as the mounting method of the light-emitting elements 41 or the light-receiving elements 51 described above may be used.

If necessary, electronic components other than the elements described above, for example, various active elements or various passive elements such as a central processing unit (CPU), a micro processor unit (MPU), an LSI, an IC, a RAM, a ROM, a capacitor, a coil, a resistor, and a diode may be mounted on the light-emitting unit substrate 2 or the light-receiving unit substrate 3.

Hereinabove, the optical module 1000 and the optical-module member 100 according to the embodiment have been described, but the number of light-emitting unit substrates 2 or the light-receiving unit substrates 3 provided in one optical module 1000 may be two or more and the number of light-emitting unit substrates 2 and the number of light-receiving unit substrates 3 may be different from each other.

In addition, the number of light-emitting element-mounting portions 22 or the number of driving element-mounting portions 23 provided in one light-emitting unit substrate 2 is not particularly limited and is preferably approximately from two or four, respectively. Further, the number of light-receiving element-mounting portions 32 or the number of signal amplification element-mounting portions 33 provided in one light-receiving unit substrate 3 is also not particularly limited and is preferably approximately from two or four, respectively.

Another Configuration Example

Figure 6:
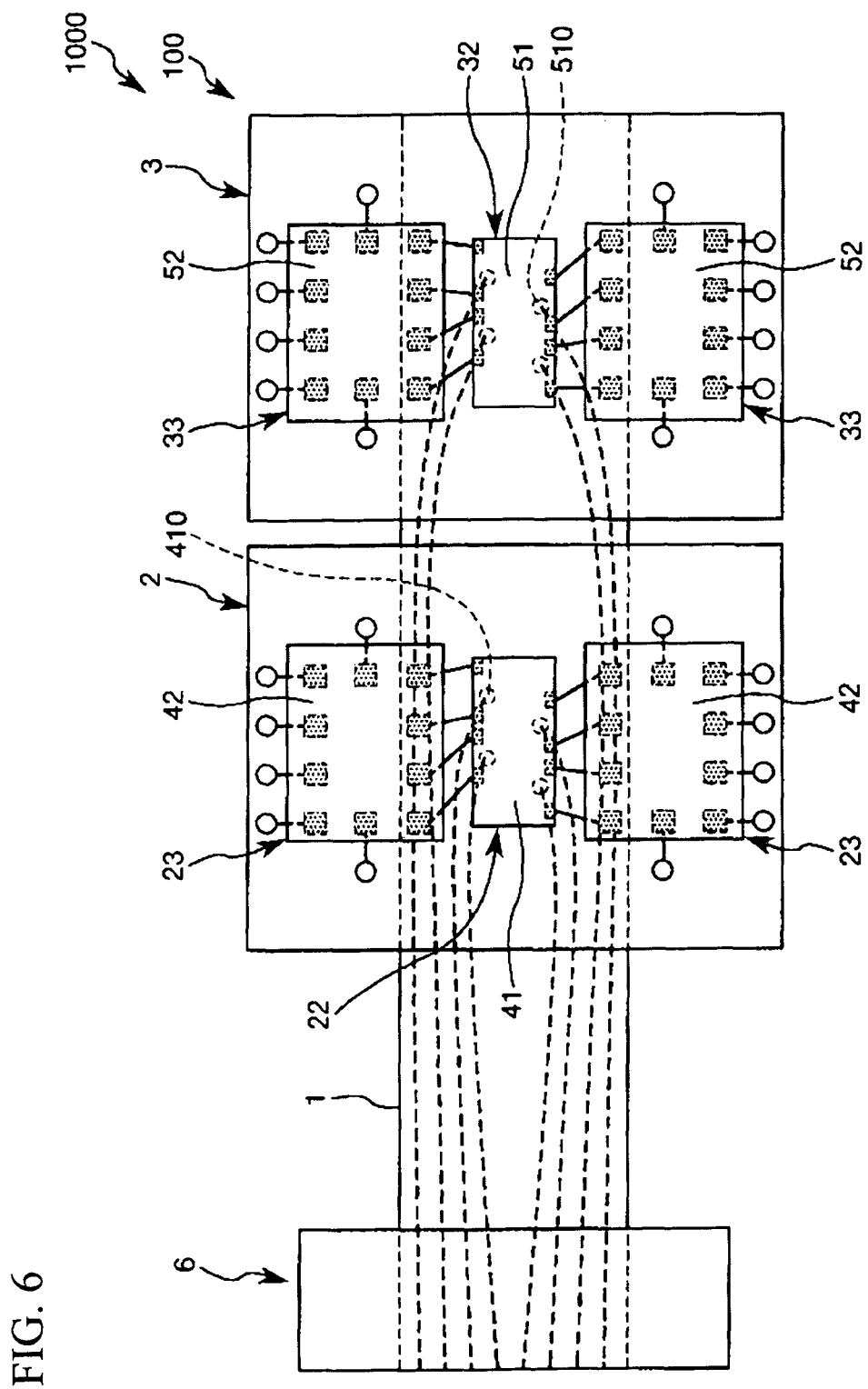
FIG. 6 is another configuration example of the optical module shown in FIG. 2.

FIG. 6 is another configuration example of the optical module shown in FIG. 2.

The optical-module member 100 shown in FIG. 6 is the same as the optical-module member 100 shown in FIG. 2, except that the configuration of the light-emitting element-mounting portions 22 and the light-receiving element-mounting portions 32 are different.

The light-emitting element 41 including four light-emitting units is configured to be mounted on the light-emitting element-mounting portion 22 shown in FIG. 6, whereas each of the light-emitting elements 41 including the two light-emitting units 410 is configured to be mounted on the light-emitting element-mounting portions 22 shown in FIG. 2. By providing such a light-emitting element-mounting portion 22, it is sufficient to mount one light-emitting element 41 on the light-emitting unit substrate 2 shown in FIG. 6, and accordingly, it is possible to reduce the number of processes in the manufacturing process of the optical module 1000.

The light-emitting element 41 is normally manufactured by setting a positional relationship between the light-emitting units 410 or a positional relationship between the terminals, and a positional relationship between the terminal and the light-emitting unit 410 substantially as designed. Accordingly, by further reducing the number of light-emitting elements 41 mounted, it is possible to precisely match a positional relationship between the plurality of light-emitting units 410 of the light-emitting elements 41 provided in the light-emitting unit substrate 2 and the plurality of inclined surfaces 171 of the optical waveguide 1 and further improve the optical coupling efficiency therebetween.

The light-receiving element 51 including four light-receiving units 510 is configured to be mounted on the light-receiving element-mounting portions 32 shown in FIG. 6, whereas each of the light-receiving element 51 including two light-receiving units 510 is configured to be mounted on the light-receiving element-mounting portions 32 shown in FIG. 2. By providing such a light-receiving element-mounting portions 32, it is sufficient to mount one light-receiving element 51 on the light-receiving unit substrate 3 shown in FIG. 6, and accordingly, it is possible to reduce the number of processes in the manufacturing process of the optical module 1000.

The light-receiving element 51 is normally manufactured by setting a positional relationship between the light-receiving units 510 or a positional relationship between the terminals, and a positional relationship between the terminal and the light-receiving unit 510 substantially as designed. Accordingly, by further reducing number of light-receiving elements 51 mounted, it is possible to precisely match a positional relationship between the plurality of light-receiving units 510 of the light-receiving element 51 provided in the light-receiving unit substrate 3 and the plurality of inclined surfaces 171 of the optical waveguide 1 and further improve the optical coupling efficiency therebetween.

Second Embodiment

Next, a second embodiment of an optical module of the invention and a second embodiment of an optical-module member of the invention will be described.

Figure 7:
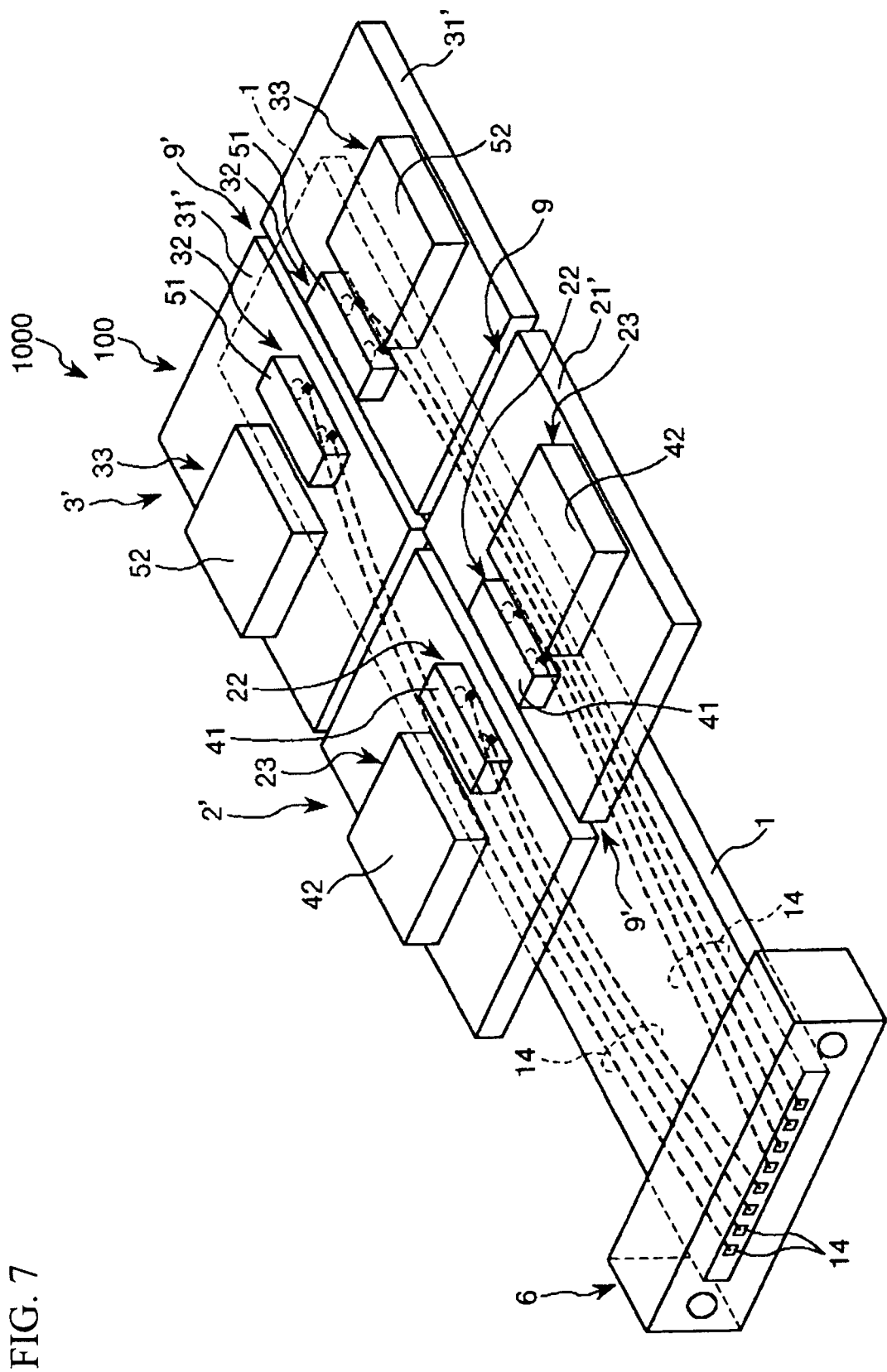
FIG. 7 is a perspective view showing a second embodiment of an optical module of the invention.
Figure 8:
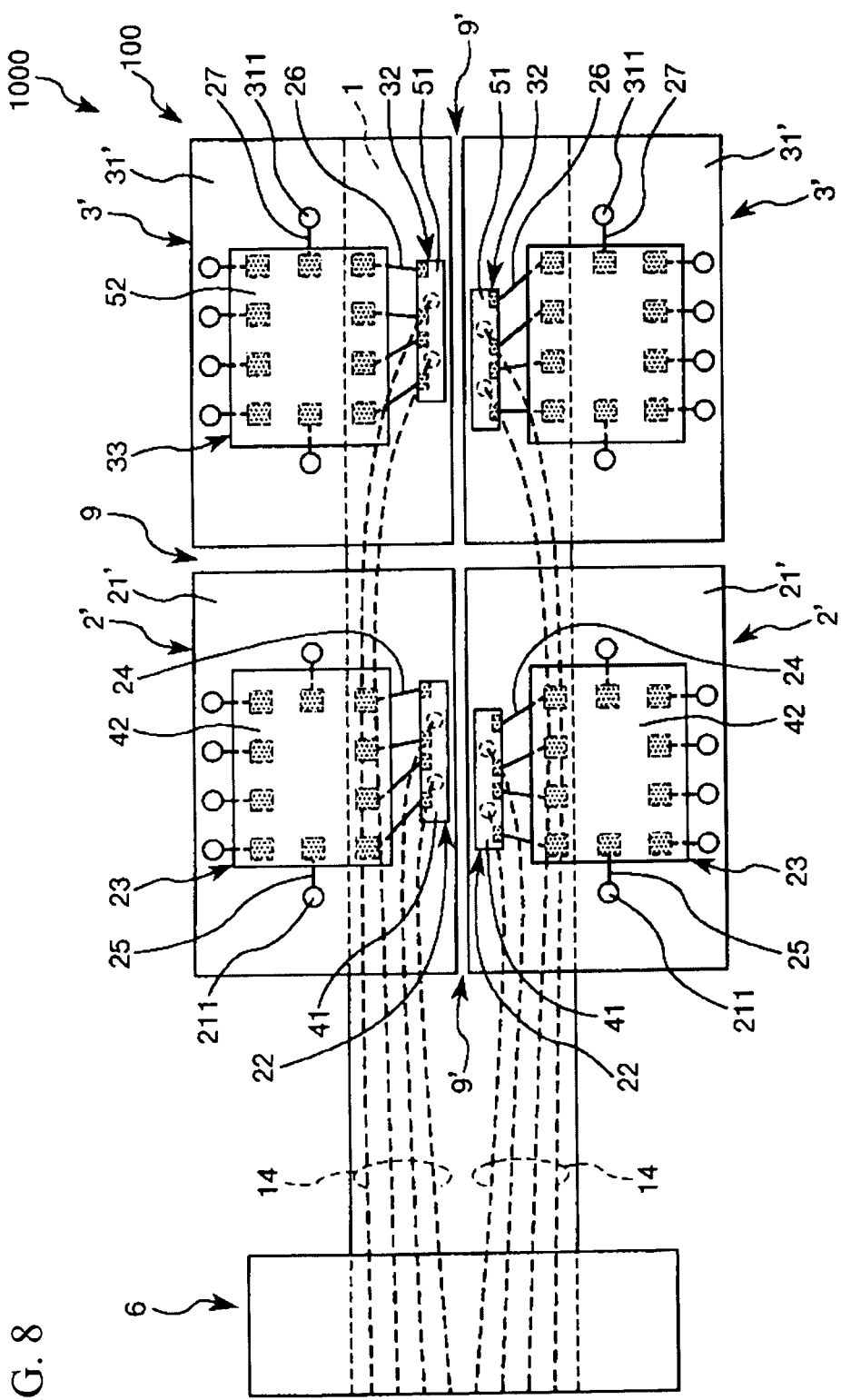
FIG. 8 is a plan view of the optical module shown in FIG. 7.

FIG. 7 is a perspective view showing the second embodiment of the optical module of the invention and FIG. 8 is a plan view of the optical module shown in FIG. 7. FIGS. 7 and 8 show an optical waveguide behind each substrate with dotted lines. The same reference numerals are used for the same constituent elements as those of the optical module described above.

Hereinafter, the second embodiment will be described, but in the following description, points different from the first embodiment will be mainly described and the description for the same configurations will be omitted.

The second embodiment has the same configuration as the first embodiment, except that the configurations of the light-emitting unit substrate 2 and the light-receiving unit substrate 3 are different.

Two light-emitting unit substrates 2' and 2' shown in FIG. 7 are equivalent to substrates obtained by dividing the light-emitting unit substrate 2 shown in FIG. 1 into two. One light-emitting element-mounting portion 22 and one driving element-mounting portion 23 are provided in each of the light-emitting unit substrate 2'. A gap 9' is provided between the two light-emitting unit substrates 2' and 2'.

Meanwhile, two light-receiving unit substrates 3' and 3' shown in FIG. 7 are equivalent to substrates obtained by dividing the light-receiving unit substrate 3 shown in FIG. 1 into two. One light-receiving element-mounting portion 32 and one signal amplification element-mounting portion 33 are provided in each of the light-receiving unit substrate 3'. The gap 9' is provided between the two light-receiving unit substrates 3' and 3'.

Insulating substrates 21' included in the respective light-emitting unit substrates 2' are equivalent to substrates obtained by dividing the insulating substrate 21 shown in FIG. 1 into two, and insulating substrates 31' included in the respective light-receiving unit substrates 3' are equivalent to substrates obtained by dividing the insulating substrate 31 shown in FIG. 1 into two.

In the second embodiment, the light-emitting unit substrate 2 is divided into two and the gap 9' therebetween is provided, and accordingly it is possible to prevent occurrence of crosstalk between the light-emitting unit substrates 2'. As a result, the electromagnetic noise superimposing on power lines or signal lines of the light-emitting elements 41 or the driving elements 42 is prevented and it is possible to prevent occurrence of malfunctions such as a decrease in an S/N ratio of a signal, a decrease in a communication speed, or an erroneous operation of the light-emitting elements 41 or the driving elements 42.

In the same manner as described above, the light-receiving unit substrate 3 is divided into two and the gap 9' therebetween is provided, and accordingly it is possible to prevent occurrence of crosstalk between the light-receiving unit substrates 3'.

In the second embodiment, one light-emitting element-mounting portion 22 is provided in one light-emitting unit substrate 2'. Accordingly, when positioning the light-emitting unit substrates 2' and the optical waveguide 1, the number of positioning targets is decreased and it is possible to perform the positioning more easily. Particularly, even when the optical waveguide 1 is slightly deformed due to effects in the process of the manufacturing or the surrounding environment and dimensions of the optical waveguide 1 are deviated from a designed value, it is possible to perform arrangement while deviating each light-emitting unit substrate 2' or each light-receiving unit substrate 3' according thereto, and accordingly, a tolerance with respect to the deformation of the optical waveguide 1 is increased. As a result, it is possible to further increase the optical coupling efficiency of the light-emitting elements 41 or the light-receiving elements 51 and the optical waveguide 1.

In the second embodiment, as a result of the division described above, the two light-emitting unit substrates 2' and the two light-receiving unit substrates 3' are connected to one optical waveguide 1. In this case, even when the number of light-emitting unit substrates 2' and light-receiving unit substrates 3' to be connected to one optical waveguide 1 is increased, it is possible to obtain an effect of the prevention of crosstalk as it is and obtain easiness of alignment as it is. Accordingly, the second embodiment is advantageous because it is possible to ensure the prevention of crosstalk and easiness of alignment, even when the number of cores 14 of the optical waveguide 1, that is, the number of channels is increased.

In the second embodiment, in addition to the case where the plurality of light-emitting unit substrates 2' and the plurality of light-receiving unit substrates 3' are connected to one optical waveguide 1, the plurality of light-emitting unit substrates 2' and one light-receiving unit substrate 3' may be connected to one optical waveguide 1. Alternatively, one light-emitting unit substrate 2' and the plurality of light-receiving unit substrates 3' may be connected to one optical waveguide 1.

The number of light-emitting unit substrates 2' and light-receiving unit substrates 3' corresponding to one optical waveguide 1 is not particularly limited, and is preferably approximately from 2 to 50, when considering the size or the like of the optical module 1000.

In the embodiment, when the two light-emitting unit substrates 2' are disposed, as shown in FIGS. 7 and 8, it is preferable that both of the two light-emitting element-mounting portions 22 be disposed to be positioned between the two driving element-mounting portions 23. By performing the arrangement as described above, it is possible to increase a separation distance between the driving elements 42 where electromagnetic noise is particularly easily generated. Accordingly, it is possible to prevent occurrence of malfunction due to electromagnetic noise superimposing on the driving element 42, the driving element 42 which is mounted on a light-emitting unit substrate 2' which is different from the light-emitting unit substrate 2' on which the previous driving element 42 is mounted, the light-emitting elements 41, and the electric wirings 24 and 25.

With the configuration described above, when the optical module 1000 is seen in a plan view as shown in FIG. 8, the optical module 1000 has the advantage that some parts of the driving element-mounting portion 23 are easily positioned on the outer sides of the range of the optical waveguide 1 (upper side and lower side of the optical waveguide 1 shown in FIG. 8). Accordingly, it is possible to further reduce a line length of the electric wiring 25 which connects the driving element-mounting portion 23 and the field via 211 formed in an insulating substrate 21', reduce the amount of electromagnetic noise occurring from the electric wiring 25, and reduce power consumption due to a decrease in electric resistance.

In the same manner as described above, when the two light-receiving elements 3' are disposed, as shown in FIGS. 7 and 8, it is preferable that both of the two light-receiving element-mounting units 32 be disposed to be positioned between the two signal amplification element-mounting portions 33. By performing the arrangement as described above, it is possible to increase a separation distance between the signal amplification elements 52 where electromagnetic noise is particularly easily generated. Accordingly, it is possible to prevent occurrence of malfunction due to electromagnetic noise superimposing on the signal amplification element 52, the signal amplification element 52 which is mounted on a light-receiving unit substrate 3' which is different from the light-receiving unit substrate 3' on which the previous signal amplification element 52 is mounted, the light-receiving elements 51, and the electric wirings 26 and 27.

With the configuration described above, when the optical module 1000 is seen in a plan view as shown in FIG. 8, the optical module 1000 has the advantage that some parts of the signal amplification element-mounting portion 33 are easily positioned on the outer sides of the range of the optical waveguide 1 (upper side and lower side of the optical waveguide 1 shown in FIG. 8). Accordingly, it is possible to further reduce a line length of the electric wiring 27 which connects the signal amplification element-mounting portion 33 and the field via 311 formed in an insulating substrate 31', reduce the amount of electromagnetic noise occurring from the electric wiring 27, and reduce power consumption due to a decrease in electric resistance.

These points are the same as in the first embodiment (FIGS. 1 and 2).

In addition, the second embodiment also has the same operations and effects as in the first embodiment.

The gap 9' between the light-emitting unit substrates 2' and the gap 9' between the light-receiving unit substrates 3' can be set in the same manner as the gap 9 according to the first embodiment. Accordingly, the same operations and effects are obtained as in a case of the gap 9.

Third Embodiment

Next, a third embodiment of an optical module of the invention and a third embodiment of an optical-module member of the invention will be described.

Figure 9:
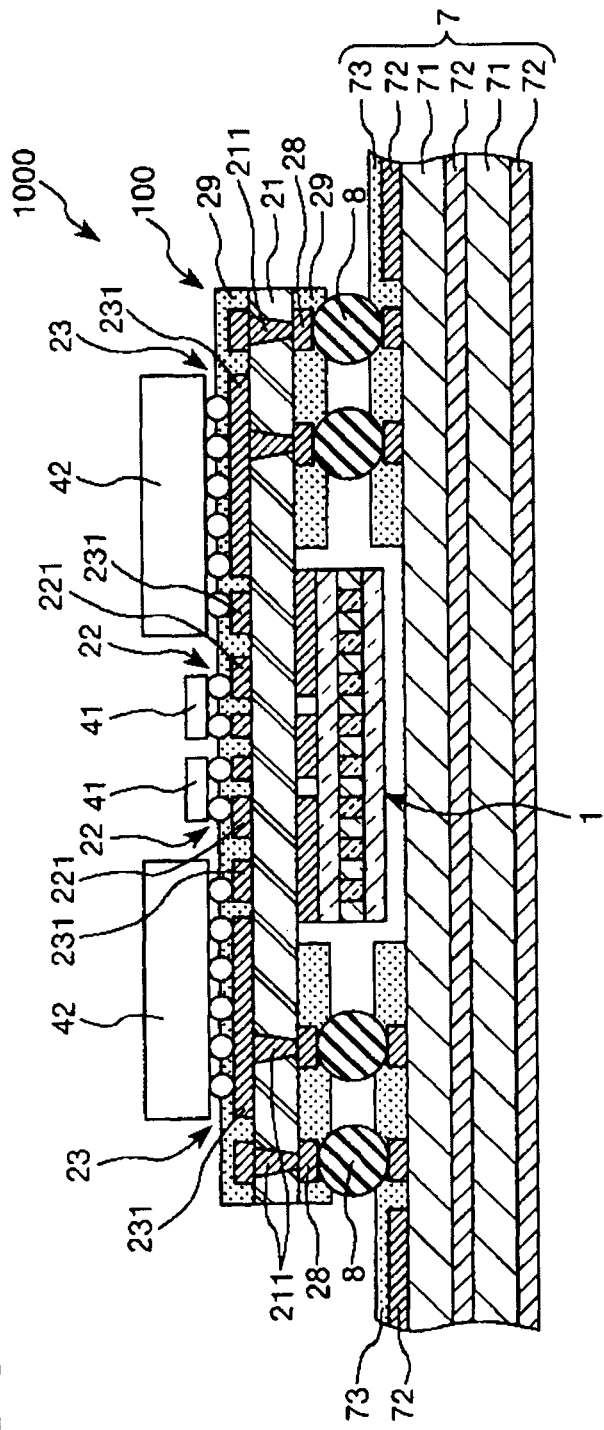
FIG. 9 is a sectional view showing a third embodiment of an optical module of the invention.

FIG. 9 is a sectional view showing the third embodiment of the optical module of the invention. In the following description, an upper side of FIG. 9 is referred to as an "upper portion" and a lower side thereof is referred to as a "lower portion".

Hereinafter, the third embodiment will be described, but in the following description, points different from the first embodiment will be mainly described and the description for the same configurations will be omitted.

The third embodiment has the same configuration as the first embodiment (FIG. 3), except that an electric circuit substrate 7 is included.

The optical module 1000 shown in FIG. 9 includes the electric circuit substrate 7 provided on the lower portion of the optical waveguide 1 and the light-emitting unit substrate 2 and the electric circuit substrate 7 are electrically and mechanically connected to each other through solder balls 8.

The electric circuit substrate 7 shown in FIG. 9 is a so-called build-up substrate and is formed by laminating insulating layers 71 and conductive layers 72 on each other and providing a solder resist layer 73 on the surface thereof. The conductive layers 72 are patterned and electric wirings are formed. Although not shown, penetration wirings are formed in the insulating layers 71 and the electric wirings are connected to each other between the layers.

As the configuration material of the conductive layer 72, the conductive materials described above are used.

Meanwhile, as the configuration material of the insulating layer 71, a silicon compound such as silicon oxide or silicon nitride or a resin material such as a polyimide resin or an epoxy resin can be used, for example.

The electric circuit substrate 7 is not limited to the build-up substrate described above, and may be a single-layered electric wiring substrate (rigid substrate), for example, or may be various flexible substrates such as a single-layered polyimide substrate, a polyester substrate, or an aramid film substrate. In addition, the build-up substrate may contain a core substrate, if necessary.

The configuration of the solder resist layer 73 is the same as the configuration of the solder resist layer 29 described above.

The electric circuit substrate 7 may be expanded further than the range shown in FIG. 9 and various electronic components described above may be mounted thereon, if necessary. The electronic components may be electrically connected to the driving element-mounting portion 23 or the signal amplification element-mounting portion 33 through the electric wirings formed in the electric circuit substrate 7. For example, when an LSI is mounted on the electric circuit substrate 7, the LSI can control the operation of the driving elements 42 or the signal amplification elements 52 and the entire optical module 1000 can be cooperatively operated.

The configuration material of the solder balls 8 is not particularly limited and various lead-containing solders, various lead-free solders, or various brazing filler metals can be used.

In the optical module 1000 shown in FIG. 9, the optical waveguide 1 is sandwiched between the light-emitting unit substrate 2 and the electric circuit substrate 7. Although not shown in FIG. 9, the optical waveguide 1 may be sandwiched between the light-receiving unit substrate 3 and the electric circuit substrate 7. With such a configuration, the optical waveguide 1 can be surrounded by the electric substrate, and accordingly, it is possible to protect the optical waveguide 1 from an external force and further increase the reliability of the optical module 1000.

In addition, the third embodiment also has the same operations and effects as in the first and second embodiments.

<Electronic Device>

As described above, in the optical module of the invention described above, crosstalk occurring between the elements is reduced, and accordingly, stable operations can be performed. In addition, since the crosstalk is reduced, the elements can be arranged to be closer to each other, and accordingly, the optical module is miniaturized. Therefore, in spite of the small size, an electronic device having high reliability which can achieve high-quality optical communication by including the optical module described above can be obtained.

Examples of the electronic device including the optical module of the invention include electronic devices such as a mobile phone, a game machine, a router device, a WDM device, a personal computer, a television, and a home server. In these electronic devices, it is necessary that large-capacity data be rapidly transmitted between an arithmetic device such as an LSI and a storage device such as a RAM, for example. Accordingly, when the electronic device includes the optical module of the invention, malfunctions such as noise or signal degradation, which are specific to electric wirings, are solved and a dramatic improvement in performance thereof can be achieved.

In addition, in the optical waveguide portion, the amount of heat generation is significantly reduced, compared to the portions of the electric wirings. Accordingly, it is possible to reduce electric power necessary for cooling and reduce power consumption of the entire electronic device.

Hereinabove, the invention has been described based on the embodiments shown in the drawings; however, the invention is not limited thereto.

For example, the optical waveguide need not have a single-layered structure and may have a multi-layered structure.

Instead of the optical connector, the light-emitting unit substrate or the light-receiving unit substrate according to each embodiment, or other photoelectric conversion components or optical connection components may be provided on another end portion of the optical waveguide.

INDUSTRIAL APPLICABILITY

It is possible to provide an optical module which reduces crosstalk occurring between elements and can perform stable operations, an optical-module member with which such an optical module can be easily manufactured, and an electronic device having high reliability including the optical module.

REFERENCE SIGNS LIST

1 Optical Waveguide
10 Laminate
11 Cladding Layer
12 Cladding Layer
13 Core Layer
14 Core
15 Side Surface Cladding Portion
170 Recess
171 Inclined Surface
172 Vertical Surface
173 Vertical Surface
174 Vertical Surface
2 Light-Emitting Unit Substrate
2' Light-Emitting Unit Substrate
21 Insulating Substrate
21' Insulating Substrate
210 Penetration Hole
211 Field Via
22 Light-Emitting Element-Mounting Portion
221 Land
23 Driving Element-Mounting Portion
231 Land
24 Electric Wiring
25 Electric Wiring 26 Electric Wiring
27 Electric Wiring
28 Electric Wiring
29 Solder Resist Layer
3 Light-Receiving Unit Substrate
3' Light-Receiving Unit Substrate
31 Insulating Substrate
31' Insulating Substrate
310 Penetration Hole
311 Field Via
32 Light-Receiving Element-Mounting Portion
321 Land
33 Signal Amplification Element-Mounting Portion
331 Land
41 Light-Emitting Element
410 Light-Emitting Unit
42 Driving Element
51 Light-Receiving Element
510 Light-Receiving Unit
52 Signal Amplification Element
6 Optical Connector
7 Electric Circuit Substrate
71 Laminating Insulating Layer
72 Conductive Layer
73 Solder Resist Layer
8 Solder Ball
9 Gap
9' Gap
100 Optical-Module Member
1000 Optical Module

The invention claimed is:

1. An optical-module member, comprising:
an optical waveguide;
a light-emitting unit substrate including
   a first insulating substrate,
   a plurality of light-emitting element-mounting portions positioned on the first insulating substrate to mount a plurality of light-emitting elements to be optically connected to the optical waveguide, and
   a plurality of driving element-mounting portions electrically connected to the light-emitting element-mounting portions and positioned on the first insulating substrate to mount a plurality of driving elements for driving the light-emitting elements; and
a light-receiving unit substrate which is separated from the light-emitting unit substrate, the light-receiving unit substrate including
   a second insulating substrate,
   a plurality of light-receiving element-mounting portions positioned on the second insulating substrate to mount a plurality of light-receiving elements to be optically connected to the optical waveguide, and
   a plurality of signal amplification element-mounting portions electrically connected to the light-receiving element-mounting portions and positioned on the second insulating substrate to mount a plurality of signal amplification elements for amplifying a signal from the light-receiving element.

2. The optical-module member according to claim 1, wherein the light-emitting unit substrate and the light-receiving unit substrate are close to each other.

3. The optical-module member according to claim 1, wherein a separation distance between the light-emitting unit substrate and the light-receiving unit substrate is from 0.05 mm to 20 mm.

4. The optical-module member according to claim 1, wherein a separation distance between the light-emitting unit substrate and the light-receiving unit substrate is equal to or greater than 0.05 mm and smaller than 5 mm.

5. The optical-module member according to claim 1, wherein the light-emitting unit substrate is disposed in a plurality, and
the light-emitting element-mounting portion of each of the light-emitting unit substrates is configured such that each light-emitting element is optically connected to the optical waveguide.

6. The optical-module member according to claim 1, wherein the light-receiving unit substrate is disposed in a plurality, and
the light-receiving element-mounting portion of each of the light-receiving unit substrates is configured such that each light-receiving element is optically connected to the optical waveguide.

7. The optical-module member according to claim 1, wherein the light-emitting unit substrate is disposed in a plurality, the light-receiving unit substrate is disposed in a plurality,
the light-emitting element-mounting portion of each of the light-emitting unit substrates is configured such that each light-emitting element is optically connected to the optical waveguide, and
the light-receiving element-mounting portion of each of the light-receiving unit substrates is configured such that each light-receiving element is optically connected to the optical waveguide.

8. The optical-module member according to claim 5, wherein two of the light-emitting unit substrates are disposed such that two of the light-emitting element-mounting portions are positioned between two of the driving element-mounting portions.

9. The optical-module member according to claim 6, wherein two of the light-receiving unit substrates are disposed such that two of the light-receiving element-mounting portions are positioned between two of the signal amplification element-mounting portions.

10. An optical module, comprising:
the optical-module member according to claim 1;
a plurality of light-emitting elements mounted on the light-emitting element-mounting portions;
a plurality of driving elements mounted on the driving element-mounting portions;
a plurality of light-receiving elements mounted on the light-receiving element-mounting portions; and
a plurality of signal amplification elements mounted on the signal amplification element-mounting portions.

11. An electronic device, comprising:
the optical module according to claim 10.

12. The optical-module member according to claim 2, wherein the light-emitting unit substrate is disposed in a plurality, and
the light-emitting element-mounting portion of each of the light-emitting unit substrates is configured such that each light-emitting element is optically connected to the optical waveguide.

13. The optical-module member according to claim 3, wherein the light-emitting unit substrate is disposed in a plurality, and
the light-emitting element-mounting portion of each of the light-emitting unit substrates is configured such that each light-emitting element is optically connected to the optical waveguide.

14. The optical-module member according to claim 4,
wherein the light-emitting unit substrate is disposed in a plurality, and
the light-emitting element-mounting portion of each of the light-emitting unit substrates is configured such that each light-emitting element is optically connected to the optical waveguide.

15. The optical-module member according to claim 2,
wherein the light-receiving unit substrate is disposed in a plurality, and
the light-receiving element-mounting portion of each of the light-receiving unit substrates is configured such that each light-receiving element is optically connected to the optical waveguide.

16. The optical-module member according to claim 3,
wherein the light-receiving unit substrate is disposed in a plurality, and
the light-receiving element-mounting portion of each of the light-receiving unit substrates is configured such that each light-receiving element is optically connected to the optical waveguide.

17. The optical-module member according to claim 4,
wherein the light-receiving unit substrate is disposed in a plurality, and
the light-receiving element-mounting portion of each of the light-receiving unit substrates is configured such that each light-receiving element is optically connected to the optical waveguide.

18. The optical-module member according to claim 12,
wherein the light-receiving unit substrate is disposed in a plurality, and
the light-receiving element-mounting portion of each of the light-receiving unit substrates is configured such that each light-receiving element is optically connected to the optical waveguide.

19. The optical-module member according to claim 13,
wherein the light-receiving unit substrate is disposed in a plurality, and
the light-receiving element-mounting portion of each of the light-receiving unit substrates is configured such that each light-receiving element is optically connected to the optical waveguide.

20. The optical-module member according to claim 14,
wherein the light-receiving unit substrate is disposed in a plurality, and
the light-receiving element-mounting portion of each of the light-receiving unit substrates is configured such that each light-receiving element is optically connected to the optical waveguide.

\* \* \* \* \*